United States Patent
Agnes

(10) Patent No.: US 11,646,733 B2
(45) Date of Patent: May 9, 2023

(54) DIGITAL OUTPUT DRIVER CIRCUIT AND METHOD

(71) Applicant: STMicroelectronics S.r.l., Agrate Brianza (IT)

(72) Inventor: Andrea Agnes, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/355,427

(22) Filed: Jun. 23, 2021

(65) Prior Publication Data

US 2021/0328587 A1 Oct. 21, 2021

Related U.S. Application Data

(63) Continuation of application No. 16/983,596, filed on Aug. 3, 2020, now Pat. No. 11,075,629.

(30) Foreign Application Priority Data

Aug. 30, 2019 (IT) .......................... 102019000015306

(51) Int. Cl.
*H03K 17/687* (2006.01)
*H02J 7/00* (2006.01)
(Continued)

(52) U.S. Cl.
CPC .......... *H03K 17/6872* (2013.01); *H02J 7/007* (2013.01); *H02M 3/158* (2013.01); *H03K 17/167* (2013.01)

(58) Field of Classification Search
CPC ........ G06F 13/00; G06F 13/4282; H02J 7/00; H02J 7/007; H02M 1/00; H02M 1/08;
(Continued)

(56) References Cited

U.S. PATENT DOCUMENTS

| 4,857,863 A | 8/1989 | Ganger et al. |
| 5,801,558 A | 9/1998 | Freyman et al. |

(Continued)

OTHER PUBLICATIONS

Shin, Soon-Kyun et al., "Slew-Rate-Controlled Output Driver Having Constant Transition Time Over Process, Voltage, Temperature, and Output Load Variations", IEEE Transactions on Circuits and Systems, TCAS-II, vol. 54, No. 7, Jul. 2007, pp. 601-605.

*Primary Examiner* — Diana J. Cheng
*Assistant Examiner* — Dave Mattison
(74) *Attorney, Agent, or Firm* — Slater Matsil, LLP

(57) ABSTRACT

In an embodiment, a digital output driver circuit comprises an output stage having first and second transistors. A drive stage is configured to drive control terminals of the first and second transistors and comprising switching circuitry and current generator circuitry. In a first configuration, the driver circuit is configured to connect a control terminal of the second transistor to the reference node to turn off the second transistor; and connect a first capacitance to the current generator circuitry and to a control terminal of the first transistor to turn on the first transistor. In a second configuration, the driver circuit is configured to turn off the first transistor and connect the control terminal of the second transistor to the current generator circuitry and to the second capacitance to turn on the second transistor.

20 Claims, 4 Drawing Sheets

(51) Int. Cl.
*H02M 3/158* (2006.01)
*H03K 17/16* (2006.01)

(58) Field of Classification Search
CPC .......... H02M 1/088; H02M 3/00; H02M 3/07;
H02M 3/158; H03K 17/00; H03K 17/163;
H03K 17/167; H03K 17/6872; H03K
19/00; H03K 19/0185
USPC ........................................................ 327/410
See application file for complete search history.

(56) References Cited

U.S. PATENT DOCUMENTS

| | | | |
|---|---|---|---|
| 6,271,699 B1 * | 8/2001 | Dowlatabadi ........ | H03K 17/167 |
| | | | 327/170 |
| 10,425,075 B1 * | 9/2019 | Consoer ................ | H02M 1/088 |
| 2018/0254650 A1 * | 9/2018 | Wang ................... | H02J 7/00047 |
| 2019/0356310 A1 * | 11/2019 | Sugie ................ | H03K 17/6872 |

* cited by examiner

-- PRIOR ART --

DIGITAL OUTPUT DRIVER CIRCUIT AND METHOD

CROSS-REFERENCE TO RELATED APPLICATIONS

This application is a continuation of U.S. patent application Ser. No. 16/983,596, entitled "Digital Output Driver Circuit and Method," and filed on Aug. 3, 2020, which claims the benefit of Italian Patent Application No. 102019000015306, filed on Aug. 30, 2019, which applications are hereby incorporated herein by reference.

TECHNICAL FIELD

The description relates to driver circuits.

BACKGROUND

The voltage of the power supply source, which may be higher than the voltage used for communication purposes, represents a factor to be taken into account in Universal Serial Port (USB) Power Delivery (USB-PD) applications.

Robust circuitry is thus desirable in order to keep the application safe in case of accidental contacts, for instance.

Also, certain solutions already proposed were found to be unsuitable for low cost technology implementations with expected voltages of 3.3 V or higher.

SUMMARY

Some embodiments contribute in facilitating USB-PD applications that are capable of operating safely also in case of accidental contacts and/or are suitable for low cost technology implementations with expected voltages of 3.3 V or higher.

One or more embodiments may be applied in complying with USB power delivery (USB-PD) specifications with the aim of regulating communications on a USB cable (type-C, for instance) prior to applying power supply.

Some embodiments relate to a circuit.

One or more embodiments relate to a corresponding method.

One or more embodiments lend themselves to be implemented by resorting to high(er) voltage metal-oxide-semiconductor field-effect transistor (MOSFET) technology.

One or more embodiments facilitate avoiding issues related to MOSFET turning-on, keeping focus on a good matching between rise time and fall time at the circuit output.

One or more embodiments may use two N-type MOSFET transistors (briefly, N-MOSFETs) in the output stage providing both falling edge and rising edge regulation.

One or more embodiments facilitate adequate operation of both output N-MOSFETs with a good matching between edges.

In one or more embodiments, such a good matching can be facilitated by double checking rising times with respect to falling times and delay times between command signals and half-height output (for both edges).

One or more embodiments may provide a circuit which is suited for use as a matched digital driver with different technologies including low-cost technologies.

Experimental results indicate that an output driver according to one or more embodiments may be adapted for applications where a constant transition time represents a desirable feature.

One or more embodiments may be advantageously applied to designing USB interfaces for which a uniform transition time regardless of environmental variations represents a desirable feature.

One or more embodiments exhibit a (very) low variation of transition delay time with capacitive output loads larger than internal capacitance. For instance, one or more embodiments can be adapted to operate adequately with a capacitive output load greater than 400 pF as contemplated by USB specifications with internal capacitances having a value smaller than 40 pF.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment," "in one embodiment," or the like, that may be present in various points of the present description do not necessarily refer exactly to one and the same embodiment. Furthermore, particular conformations, structures, or characteristics may be combined in any adequate way in one or more embodiments. The references used herein are provided merely for convenience and hence do not define the extent of protection or the scope of the embodiments.

Figure 1:
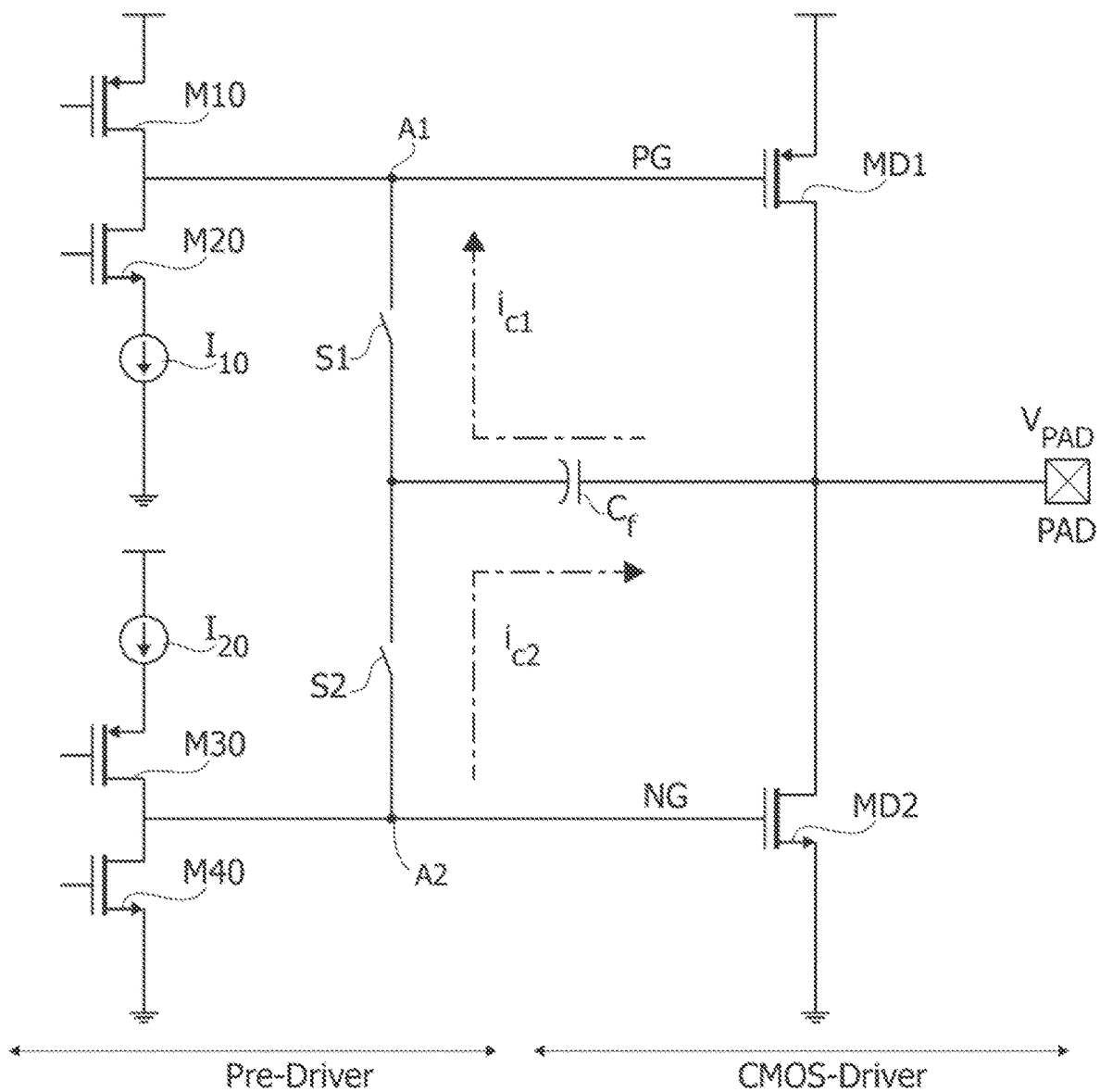
FIG. 1 is a circuit diagram of a driver circuit.

FIG. 1 is a circuit diagram of an output driver circuit with controlled slew-rate as discussed in S. K. Shin, et al.: "Slew-Rate-Controlled Output Driver Having Constant Transition Time Over Process, Voltage, Temperature, and Output Load Variations", IEEE Transactions on Circuits and Systems, TCAS-II, Vol. 54, No. 7, July 2007, p. 601.

That conventional solution provides a slew-rate-controlled output driver having a constant transition time irrespective of environmental variations.

The solution exemplified in FIG. 1 employs a capacitive feedback (capacitor $C_f$) between the circuit output $V_{PAD}$ as sensed at a PAD node between two output CMOS-Driver transistors MD1 and MD2 and a node between two switches S1 and S2 in a pre-driver stage. The switches S1 and S2 are configured to couple the capacitor $C_f$ (to draw and inject currents $i_{c1}$ and $i_{c2}$) to respective intermediate points A1 and A2 between pairs of complementary P-type and N-type MOSFET transistors M10, M20 and M30, M40 that provide flow paths therethrough for currents $I_{10}$ and $I_{20}$, respectively and the control terminals (gates PG and NG) of the CMOS driver transistors MD1 and MD2.

As reported, the solution exemplified in FIG. 1 was designed and fabricated using a 0.13-mum CMOS process to allow transition times which are independent of process, voltage, temperature and output load variations. For instance, a normalized variation on transition time of the output driver due to PVT variations is reported to be improved by 74%-80% as compared to a conventional output driver, with comparison results indicating a normalized variation on transition time due to output load change from 10 pF to 100 pF (10 times variation) in typical process, voltage and temperature corners improved up to 66%.

The solution exemplified in FIG. 1 may comply with USB specifications if supplied with a voltage of 1.2 V. It is noted that such a driver would be vulnerable to an accidental contact of the output (at the PAD node) with a voltage higher than the indicated voltage supply.

The output robustness of a solution as exemplified in FIG. 1 could be improved by adopting "higher voltage" MOSFET technology (e.g., 3.3 V MOSFET). It is noted that such a choice may give rise to functional issues insofar as the voltage threshold of each MOSFET might be greater than 1.2 V.

Another option which might be possibly considered would involve applying two different voltages to the CMOS-driver stage (MD1 and MD2) and to the pre-driver stage (which includes the pairs M10, M20 and M30, M40). While on the hand facilitating turn-on of MD2, no such effect could be expected for MD1.

Figure 2:
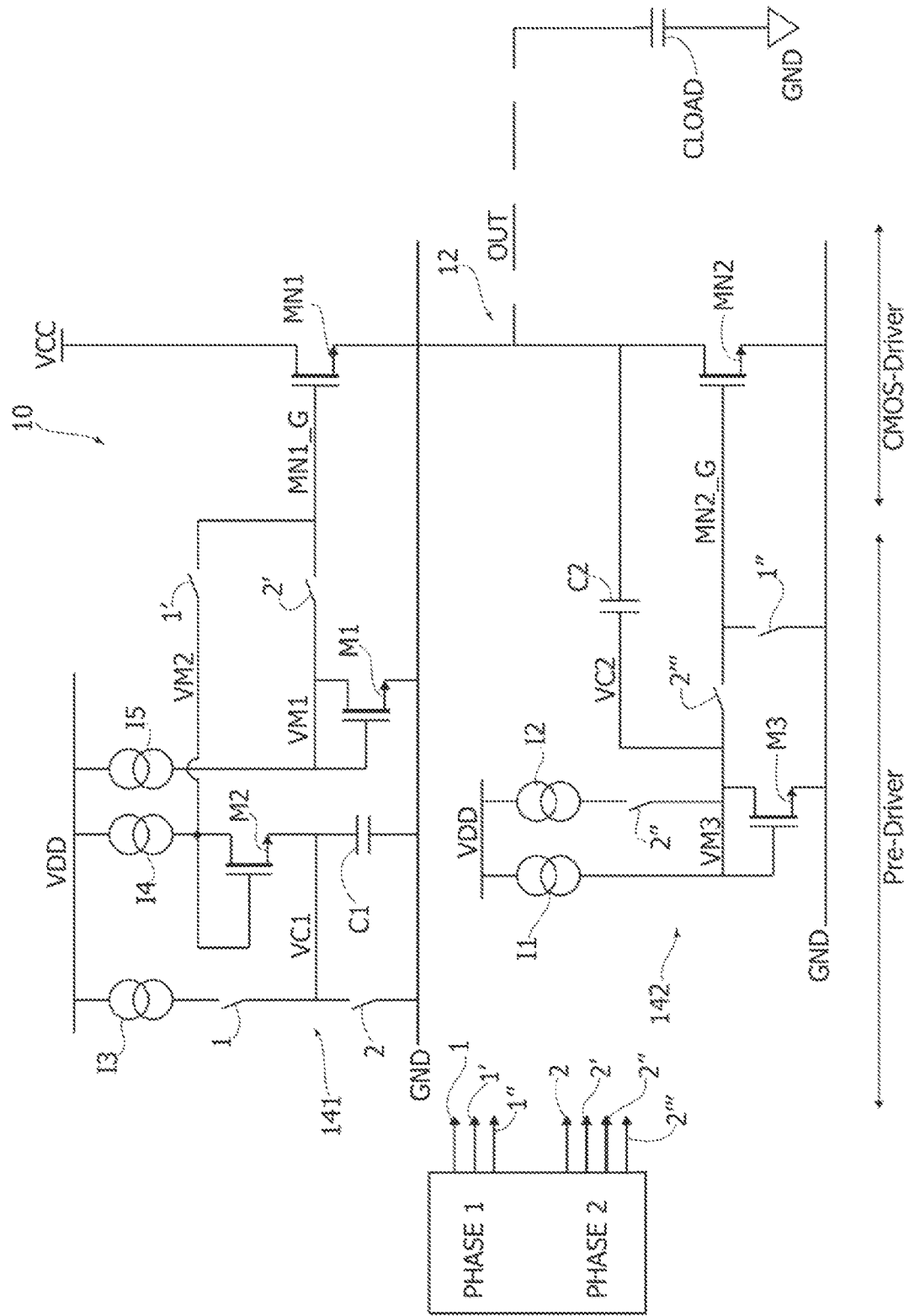
FIG. 2 is an exemplary circuit diagram of a driver circuit, according to embodiments of the present invention.

One or more embodiments may address these issues by resorting to a driver circuit 10 as exemplified in FIG. 2.

The circuit 10 as exemplified in FIG. 2 comprises a driver stage (CMOS, for instance) 12 including two (output) transistors (N-channel MOSFET, for instance) MN1 and MN2. These transistors have current paths therethrough (source-drain in the case of field effect transistors such MOSFETs) providing a current flow line from a supply voltage line VCC and ground GND with an output node OUT between MN1 and MN2.

For instance, as exemplified in FIG. 2, MN1 has its drain coupled to the voltage line VCC and its source coupled to the output node OUT, and MN2 has its drain coupled to the output node OUT and its source coupled to ground GND.

The circuit 10 as exemplified in FIG. 2 also comprises a pre-driver stage configured to drive the control terminals (gates, in the case of field effect transistors such MOSFETs) MN1_G and MN2_G of MN1 and MN2, respectively. To that effect, such a pre-driver stage can comprise two sub-stages designated 141 and 142, coupled between a (possibly common) supply voltage line VDD, which may be brought to a voltage different from the voltage of the line VCC, and ground GND.

As exemplified herein, the sub-stage 141 comprises two transistors (N-channel MOSFET, for instance) M1 and M2, and the sub-stage 142 comprises a transistor (N-channel MOSFET, for instance) M3.

As exemplified in FIG. 2, the sub-stage 141 comprises a current line from VDD to ground GND comprising a current generator I3 coupled to VDD as well as a first switch 1 and a second switch 2 with the first switch 1 between I3 and the second switch 2. Another current line from VDD to ground GND comprises a current generator I4 coupled to VDD as well as the current path (source-drain in the case of field effect transistors such as a MOSFET) through M2 and a capacitor C1 with M2 between I4 and the capacitor C1. As exemplified herein, M2 has its drain coupled to I4, the source coupled to C1 and to an intermediate point between the switches 1 and 2 and configured to receive at that point a voltage VC1 across the capacitor C1. As exemplified herein, M2 is in a diode-like configuration with its current path shorted (at the drain in the case of field effect transistors such as a MOSFET) to the control terminal (gate, in the case of a field effect transistor such as a MOSFET).

A further current line from VDD to ground GND comprises a current generator I5 coupled to VDD as well as to M1 in a diode-like configuration with its current path shorted (at the drain, in the case of field effect transistors such as a MOSFET, for instance) to the control terminal (gate in the case of a field effect transistor such as a MOSFET) and coupled to I5 and its current path (at the source, in the case of field effect transistor such as a MOSFET) coupled to ground GND. The sub-stage 141 also comprises a third switch 1' and a fourth switch 2'.

As exemplified in FIG. 2, the third switch 1' is coupled between the control terminal (gate, in the case of a field effect transistor such as a MOSFET) shorted to the current path (source-drain, in the case of a field effect transistor such as a MOSFET) of M2 and the control terminal MN1_G (gate, in the case of a field effect transistor such as a MOSFET) of MN1. The fourth switch 2' is coupled between the control terminal (gate, in the case of a field effect transistor such as a MOSFET) shorted to the current (gate-to-drain, in the case of a field effect transistor such as a MOSFET) of M1 and the control terminal MN1_G (gate, in the case of a field effect transistor such as a MOSFET) of MN1.

The switches 1' and 2' are indicated with the same basic designation of the first switch 1 and the second switch 2 discussed in the foregoing to indicate that the switches 1, 1' and the switches 2, 2' will be operated the same manner, that is with switch 1' being open or closed as a result of switch 1 being open or closed, respectively, and with switch 2' being open or closed as a result of switch 2 being open or closed, respectively.

As exemplified in FIG. 2, the sub-stage 142 comprises a current line from VDD to ground GND comprising a current generator I1 coupled to VDD as well as to M3 in a diode-like configuration with its current path shorted (at the drain in the case of field effect transistors such as a MOSFET) to the control terminal (gate in the case of a field effect transistor such as a MOSFET) with a voltage VM3 present at that shorting node. Another current line from VDD to ground GND comprising a current generator I2 coupled to VDD as well as to a fifth switch 2" in turn coupled to M3 in a diode-like configuration with its current path shorted (at the drain in the case of field effect transistors such as a MOSFET) to the control terminal (gate in the case of a field effect transistor such as a MOSFET).

As exemplified in FIG. 2, the voltage VM3 present at that shorting node is adapted to be coupled to the output node OUT via a (second) capacitor C2 and to the control terminal MN2_G (gate, in the case of a field effect transistor such as a MOSFET) of MN2 via a sixth switch 2'''. As exemplified in FIG. 2, a seventh switch 1" is provided configured to act between the control terminal MN2_G (gate, in the case of a field effect transistor such as a MOSFET) of MN2 and ground GND with the capability of forcing MN2_G to ground level.

Again, a same basic designation of the first switch 1 and the second switch 2 discussed in the foregoing being used for the switches 1", 2", 2'" indicates that the switch 1" and the switches 2", 2'" will be operated in the same manner of the switches 1 and 2, that is with switch 1" being open or closed as a result of switch 1 being open or closed, respectively, and with switches 2", 2'" being open or closed as a result of switch 2 being open or closed, respectively.

The current generators I1, I2, I3, I4 and I5 can be implemented in any manner known to those of skill in the art for that purpose. The same also applies to the switches 1, 2, 1", 2" and 2'", which can be implemented as electronic switches such as transistors, for instance.

As exemplified in FIG. 2, a capacitive load CLOAD can be coupled between the output node OUT and ground GND. It will be appreciated that the load CLOAD may be a distinct element from the embodiments.

One or more embodiments lend themselves to be implemented with "higher voltage" MOSFET technology avoiding issues related to MOSFET turn-on, keeping focus on a good matching between rise time and fall time of the output.

For instance, the circuit 10 can be implemented with a 3.3 V technology or greater. VCC can be 1.8V or less, as a function of the voltage levels used for (USB, for instance) communication. In one or more embodiments VDD can be set at a same value for both sub-stages 141 and 142, which is higher than VCC (VCC+1.5 V, for instance) in order to facilitate driving MOSFET transistors effectively.

Figure 3:
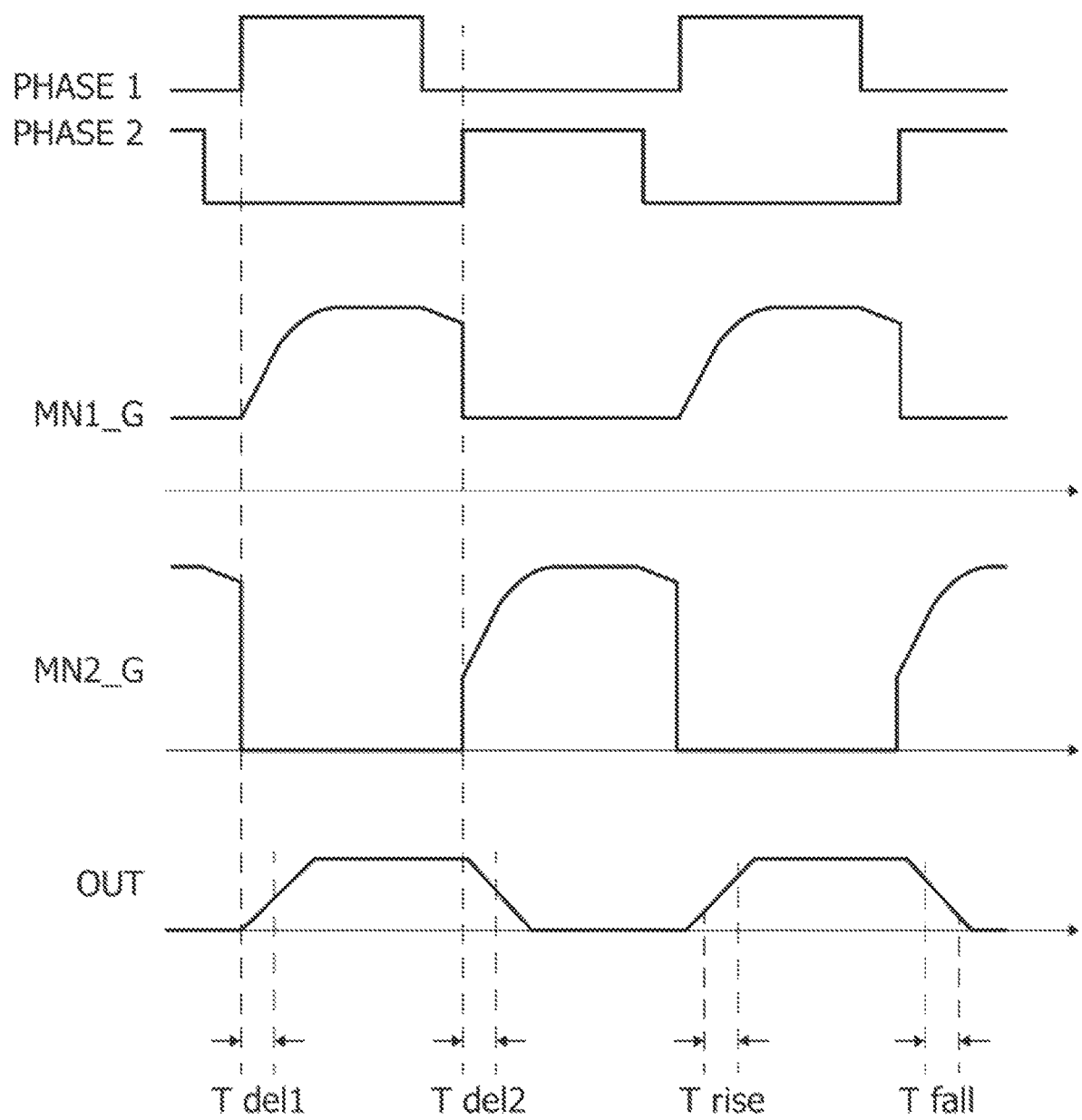
FIG. 3 is a collection of time diagrams associated with the circuit of FIG. 2, according to an embodiment of the present invention.

A CMOS-driver section 12 as exemplified herein facilitates achieving desired voltages, slopes and delays to the output node OUT with respect to the clock switching of the switches 1, 2, 1', 2', 1", 2", 2'" from PHASE 1 (1, 1', 1" closed and thus conductive—signal 1 "high" in the uppermost diagram in FIG. 3) to PHASE 2 (2, 2', 2", 2'" closed and thus conductive—signal 2 "high" in the second uppermost diagram in FIG. 3) and vice-versa.

The "phases" 1 and 2 indicative of the switch positions may be related to digital bits intended to be transmitted from a transmitted TX over a communication line (USB, for instance) as represented by the load CLOAD, as shown, by way of example, in the lowermost diagram in FIG. 3 where an on-off (essentially, ASK modulated) two-valued signal at the output node OUT from the circuit 10 whose timing is controlled via phase signals PHASE 1 and PHASE 2 in the two uppermost diagrams.

As may be appreciated from these two uppermost diagrams of FIG. 3, these "phase" signals may not necessarily be square-wave clock signals. Also, like the load CLOAD, the transmitter TX may be a distinct element from the embodiments.

Possible operation of a circuit 10 as exemplified herein can be described (by referring to an exemplary implementation where MN1, MN2, M1, M2 and M3 are field effect transistors such as N-type or N-channel MOSFET transistors) and assuming to start from a (PHASE 1) condition (switches 1, 1' and 1" closed and thus conductive with switches 2, 2', 2" and 2'" open and non-conductive) where the (e.g., capacitive) load CLOAD and C1 completely discharged, that is with the signal at the output node OUT (briefly, the signal OUT) and the voltage VC1 across C1 equal to 0 V, as shown in the diagrams in FIG. 3.

The gate of MN1 (MN1_G) is coupled to the mutually shorted gate and drain of M1, thus setting the starting voltage of MN1_G slightly under the conduction threshold MN1 MOSFET.

In PHASE 1 the gate of MN2 (MN2_G) is held coupled to ground by the switch 1", so that MN2 is off (non-conductive). The capacitor C1 will start charging at a constant current (I3+I4), and the voltage VC1 across C1 will grow with a constant rate (I3+I4)/C1. The transistor M2 will operate at a constant current, thus developing a constant voltage between its drain (at a voltage VM) and its source (at a voltage VC1). As consequence, the voltage MN1_G will grow at a constant rate, starting from a defined voltage (threshold of M2), as shown, for instance, in the third diagram in FIG. 3.

As the voltage MN1_G goes high, the currents I3 and I4 will undergo a saturation effect, reducing their growth rate, with a negligible effect on OUT if VDD is higher than VCC (VDD>VCC+1.5 V, for instance).

As visible, for instance, in the diagram at the lowermost of FIG. 3, a ramp as applied to MN1_G will result in a ramp on OUT (that is, the voltage at the output node OUT), replicated with a same slope.

By assuming (which is a judicious assumption under the circumstances considered herein) that the load CLOAD coupled with the output node OUT is essentially a large capacitance (CLOAD>>C1), the constant ramp will result in a constant-current capacitance charging until the voltage across CLOAD reaches VCC with the voltage on MN1_G reaching VDD, thus facilitating having MN1 on (that is conductive) with a (very) low equivalent resistance.

The circuit 10 as exemplified herein will operate statically until Phase1 finishes, with MN1_G becoming a high-impedance node and capacitances (C1 and COUT) "holding" the situation.

At the starting point of phase 2 (switches 1, 1' and 1" open and thus non-conductive with switches 2, 2', 2" and 2'" closed and conductive) CLOAD can be assumed to be fully charged to VCC, that is the signal OUT is equal to VCC, as shown, e.g., in the diagrams in FIG. 3.

The capacitance C1 will be shorted by the switch 2 so that the voltage across the capacitance C1, namely VC1, will be zero (ground level GND).

The gate of MN1 (MN1_G) will be coupled to M1 that has its gate and its drain mutually shorted, thus holding the voltage at MN1_G slightly under the threshold of MN1 MOSFET, which will be in an off state (non-conductive) till the end of the PHASE 2.

As a result of the switch 1" being now open and the switches 2" and 2'" closed, the gate MN2_G of MN2 will switch from ground connection GND to the threshold of M3 and become increasingly conductive.

The currents I1+I2 will rapidly bring the voltage at MN2_G to the threshold of MN2 and so that MN2 will operate in a saturation state with the capacitance C2 between its drain and gate with a voltage VC2 across C2. The saturation state of MN2 facilitates a constant fall time of the signal OUT until the end of the transition.

Exiting the saturation state (that is OUT<MN2_G—the respective threshold) gives rise to a saturation effect on discharging the load capacitance CLOAD, with a negligible effect insofar as (this is again a judicious assumption under the conditions considered) CLOAD>>C2.

After the completion of the transition, MN2_G goes to VDD and turns MN2 fully on.

One or more embodiments may facilitate a desirable matching of rising and falling edges (Trise and Tfall, respectively) of the signal OUT applied by the circuit 10 to a load such CLOAD, as shown, e.g., in the diagram at the lowermost of FIG. 3 (Trise is about equal to Tfall).

To that effect, complying with the following specifications was found to be advantageous:

currents I1=I4 and I4=I5 (starting condition)

currents I1+I2=I3+I4 (charging condition)

same dimensions of M1, M2 and M3 (MOSFETs, for instance)

same dimensions of MN1 and MN2 same capacitance values C1 and C2

CLOAD>>C1, CLOAD>>C2 (for instance, CLOAD=400 pF and C1=C2=40 pF).

Pre-charging the gates MN1_G and MN2_G at starting point voltages as already defined was similarly found to be beneficial in matching the "on" delay from digital control switching to the half-height condition of the OUT signal switching (as shown, e.g., by Tdel1, Tdel2 in the lowermost diagram of FIG. 3).

One or more embodiments facilitate achieving a high output level in excess of 1.04 V, for instance in the range 1.103 V-1.137 V.

One or more embodiments equally facilitate achieving a low output level under 70 mV, for instance in the range 0.3 mV-24.2 mV.

Experimental results indicated that, in one or more embodiments, the temperature variation in the signal OUT is in compliance with a USB mask as defined in standards. Variations in matching between components, load capacitance, reference currents and temperature were found to lead to accuracy in the signal OUT (in terms of edges and delays) in compliance with USB standard specifications.

Figure 4:
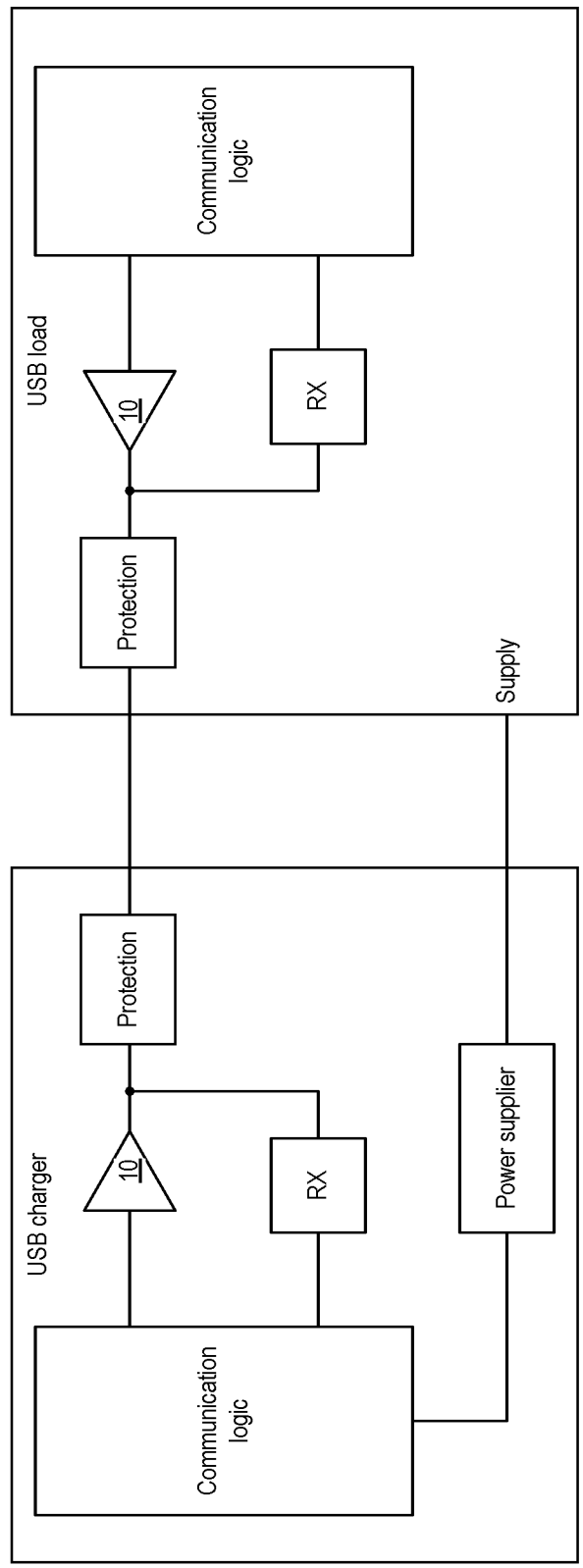
FIG. 4 shows a possible implementation of the circuit of FIG. 2 in a USB system, according to an embodiment of the present invention.

FIG. 4 shows a possible implementation of circuit 10 in a USB system, according to an embodiment of the present invention. The communication logic, receiver circuit RX, protection circuit, and power supplier circuit of the USB charger, as well as the communication logic, receiver circuit RX, and protection circuit of the USB load may be implemented in any way known in the art.

A circuit (for instance, 10) as exemplified herein may comprise an output stage having a supply node (for instance, VCC) and an output node (for instance, OUT) and comprising a first transistor (for instance, MN1) and a second transistor (for instance, MN2) having current paths therethrough (source-drain, in the exemplary case of field effect transistors such as MOSFET) coupled between the supply node and the output node (in the exemplary case of case of MN1) and between the output node and ground (in the exemplary case of case of MN2) respectively, the first transistor and the second transistor having respective control terminals (for instance, gates such as MN1_G, MN2_G in the exemplary case of field effect transistors such as MOSFETs).

A drive stage (for instance, 141, 142) is configured to drive the control terminals of the first transistor and the second transistor, the drive stage comprising a first capacitance (for instance, C1) and a second capacitance (for instance, C2), current generator circuitry (for instance, I1, I2, I3, I4, I5) coupled to at least one further supply node as well as switching circuitry (for instance, 1, 2, 1', 2', 1'', 2'', 2'''), the switching circuitry configured to admit:

a first configuration (for instance, PHASE 1), wherein the control terminal of the second transistor is coupled (for instance, via 1'') to ground with the second transistor in an off (non-conductive) state and the first capacitance coupled (for instance, via 1, M2) to the current generator circuitry (for instance, I3, I4) and (for instance, via 1') to the control terminal of the first transistor with the first transistor in an on (conductive) state, wherein a voltage at the output node increases towards the voltage at the supply node, a second configuration (for instance, PHASE 2) wherein the control terminal of the first transistor (MN1) is coupled (for instance, via 2') to a turn-off voltage (for instance, VM1) of the first transistor with the first transistor in an off (non-conductive) state and the control terminal of the second transistor is coupled (for instance, via 2'', 2''') to the current generator circuitry (for instance, I1, I2) with the second transistor in an on (conductive) state, with the second capacitance coupled (for instance, via 2''') between the output node and the control terminal of the second transistor (MN2) wherein the voltage at the output node decreases from the voltage at the supply node towards ground.

In a circuit as exemplified herein, the drive stage may comprise a first sub-stage (for instance, 141) and a second sub-stage (for instance, 142). The first sub-stage is configured to drive the control terminal of the first transistor, the first sub-stage comprising the first capacitance, a first subset (for instance, I3, I4, I5) of the current generator circuitry coupled to a first further supply node (for instance VDD), as well as a first subset (for instance, 1, 2, 1', 2') of the switching circuitry. The second sub-stage (for instance, 142) is configured to drive the control terminal of the second transistor, the second sub-stage comprising the second capacitance (C2), a second subset (for instance, I1, I2) of the current generator circuitry coupled to a second further supply node (for instance, VDD) as well as a second subset (for instance, 1'', 2'', 2''') of the switching circuitry.

In a circuit as exemplified herein, the first sub-stage may comprise a charge current source (for instance, I3, I4) with the first subset (for instance, 1, 2, 1', 2') of the switching circuitry configured to, in the first configuration, couple the first capacitance with the charge current source (for instance, I3, I4, via 1) and with the control terminal (for instance, MN1_G via 1') of the first transistor, and a turn-off current generator (for instance, I5) with the first subset of the switching circuitry configured to, in the second configuration, short-circuit (for instance, via 2) the first capacitance and couple (for instance, via 2') the turn-off current generator to the control terminal of the first transistor to apply the turn-off voltage thereto.

In a circuit as exemplified herein the charge current source in the first sub-stage (141) may comprise a first current generator (I3) with the first subset (1) of the switching circuitry configured to, in the first configuration (PHASE 1), couple the first capacitance (C1) with the first current generator (I3), and a second current generator (I4) coupled with the first capacitance (C1) via a transistor (M2) having a control terminal and a current path therethrough coupled in a diode-like configuration with the first subset (1') of the switching circuitry configured to, in the first configuration (PHASE 1), couple the control terminal and the current path through the transistor (M2) in a diode-like configuration with the control terminal (MN1_G) of the first transistor (MN1).

In a circuit as exemplified herein, the turn-off current generator in the first sub-stage may be coupled to a turn-off voltage generating transistor (for instance, M1) having a control terminal and a current path therethrough coupled in a diode-like configuration with the first subset of the switching circuitry configured to, in the second configuration, couple the control terminal and the current path through the turn-off voltage generating transistor with the control terminal of the second transistor (for instance, via 2').

In a circuit as exemplified herein, the second sub-stage may comprise the second subset of the switching circuitry configured (for instance, 1'') to, in the first configuration, couple to ground the control terminal of the second transistor, a drive voltage generating transistor (for instance, M3) having a control terminal and a current path therethrough coupled in a diode-like configuration, a first current generator (for instance, I1) coupled with the control terminal and the current path through the drive voltage generating transistor in a diode-like configuration, wherein the drive voltage generating transistor is arranged intermediate the first current generator and ground with its control terminal and the current path therethrough coupled to the output node via the second capacitance, and a second current generator (for instance, I2) with the second subset of the switching circuitry configured to, in the second configuration, couple the control terminal and the current path through the drive voltage generating transistor in a diode-like configuration with the second current generator (for instance, I2, via 2") and the control terminal of the second transistor (for instance, MN2 via 2'").

In a circuit as exemplified herein the second current generator (for instance, I4) in the charge current source and the turn-off current generator (for instance, I5) in the first sub-stage and the first current generator (for instance, I1) in the second sub-stage are configured to produce a same current intensity (that is I1=I4 and I4=I5), and the summed intensities (for instance, I1+I2) of the currents produced by the first current generator (for instance, I1) and the second current generator (for instance, I2) in the second sub-stage are equal to the summed intensities (for instance, I3+I4) of the currents produced by the first current generator (for instance, I3) and the second current generator (for instance, I4) in the charge current source in the first sub-stage.

In a circuit as exemplified herein, the first transistor and the second transistor may comprise transistors of a homologous type (optionally both N-channel field effect transistors, and/or MOSFET transistors, and/or transistors having the same dimensions.

In a circuit as exemplified herein the first capacitance and the second capacitance have a same capacitance value.

A circuit as exemplified herein may have a capacitive load (for instance, CLOAD) coupled to the output node, with the capacitive load having a capacitance value which may be substantially larger (for instance, ten times larger) than the capacitance value of the first capacitance and the second capacitance.

A method of operating the circuit (10) In a circuit as exemplified herein may comprise actuating the switching circuitry (for instance, the first, 1; second, 2; third 1', fourth 2'; fifth 1"; sixth 2"; and seventh 2'" switches) in the drive stage alternatively between the first configuration (for instance, PHASE 1) the second configuration (for instance, PHASE 2), wherein the voltage at the output node transitions towards and away the voltage at the supply node, as shown, for instance, in the lowermost diagram in FIG. 3.

A method as exemplified herein may comprise applying to the at least one further supply node (for instance, VDD) of the drive stage a voltage higher than the voltage applied to the supply node (for instance, VCC) of the output stage (for instance, with VDD>Vcc+1.5V).

Without prejudice to the underlying principles, the details and the embodiments may vary, even significantly, with respect to what has been described by way of example only without departing from the scope of the embodiments.

The extent of protection is determined by the annexed claims.

What is claimed is:

1. A driver comprising:
an output terminal;
a first supply terminal configured to receive a first supply voltage;
a second supply terminal configured to receive a reference voltage;
a first transistor of a first type having a first current path terminal coupled to the output terminal and a second current path terminal coupled to the first supply terminal;
a second transistor of the first type having a first current path terminal coupled to the second supply terminal, and a second current path terminal coupled to the output terminal;
a first current generator;
a second current generator;
a third current generator;
a first capacitance coupled between the first current generator and the second supply terminal;
a second capacitance having a first terminal coupled to the output terminal;
a first switch coupled between a control terminal of the second transistor and the second supply terminal;
a second switch coupled between the first capacitance and the first current generator;
a third switch coupled between the first capacitance and a control terminal of the first transistor;
a fourth switch coupled between the second current generator and the control terminal of the first transistor; and
a fifth switch having a first terminal and a second terminal, the first terminal of the fifth switch coupled to the third current generator and a second terminal of the second capacitance, the second terminal of the fifth switch coupled to the control terminal of the second transistor.

2. The driver of claim 1, wherein the first and second transistors are metal— oxide—semiconductor field-effect transistors (MOSFETs), wherein the first type is an n-type, wherein the first and second current path terminals of the first transistor are source and drain terminals of the first transistor, respectively, and wherein the first and second current path terminals of the second transistor are source and drain terminals of the second transistor, respectively.

3. The driver of claim 1, further comprising a fourth current generator, and a third transistor having a current path coupled between the fourth current generator and the first capacitance, and a control terminal coupled to the third switch.

4. The driver of claim 3, further comprising a fourth transistor having a current path coupled between the second current generator and the second supply terminal, and a control terminal coupled to the fourth switch.

5. The driver of claim 4, wherein the third and fourth transistors are transistors of the first type.

6. The driver of claim 1, further comprising a third transistor having a current path coupled between the second capacitance and the second supply terminal, and a control terminal coupled to the second capacitance.

7. The driver of claim 1, wherein the second capacitance is coupled between the output terminal and the third current generator.

8. The driver of claim 1, wherein the driver is configured to:
alternate between a first configuration and a second configuration, wherein the first configuration corresponds to an increase in a voltage at the output terminal towards the first supply voltage, and wherein the second configuration corresponds to a decrease in the voltage at the output terminal towards the reference voltage,
in the first configuration,
close the first switch to turn off the second transistor, and
close the second and third switches to turn on the first transistor, and
in the second configuration,
close the fourth switch to turn off the first transistor, and
close the fifth switch to turn on the second transistor.

9. The driver of claim 8, wherein the driver is further configured to:
close the first, second, and third switches at the same time, and
close the fourth and fifth switches at the same time.

10. A circuit comprising:
an output stage comprising:
a first supply node,
an output node,
a reference node,
a first n-type transistor having a first current path coupled between the first supply node and the output node, and
a second n-type transistor having a second current path coupled between the output node and the reference node; and
a drive stage configured to drive control terminals of the first and second n-type transistors, the drive stage comprising:
a third transistor having a first current path terminal and a control terminal coupled to the control terminal of the first n-type transistor,
a first capacitance coupled between a second current path terminal of the third transistor and the reference node,
a second capacitance having a first terminal coupled to an output node; and
a fourth transistor having a first current path terminal, a second current path terminal, and a control terminal, the control terminal coupled to a current generator, the first current path terminal coupled to second n-type transistor and a second terminal of the second capacitance, and the second current path terminal coupled to the reference node.

11. The circuit of claim 10, wherein the drive stage further comprises a fifth transistor having a first current path terminal coupled to the reference node, and a second current path terminal and a control terminal coupled to the control terminal of the first n-type transistor.

12. The circuit of claim 11, wherein the drive stage further comprises:
a first current generator coupled to the first current path terminal of the third transistor and to the control terminal of the first n-type transistor;
a second current generator coupled to the second current path terminal of the fifth transistor and to the control terminal of the first n-type transistor; and
a first switch coupled between the second current path terminal of the fifth transistor and the first current path terminal of the third transistor.

13. The circuit of claim 12, wherein the drive stage further comprises a second switch coupled between the second current path terminal of the fifth transistor and the control terminal of the second n-type transistor.

14. The circuit of claim 11, wherein the drive stage further comprises:
a first switch coupled between the control terminal of third transistor and the control terminal of the first n-type transistor;
a second switch coupled between the second current path terminal of the fifth transistor and the control terminal of the first n-type transistor;
a third switch coupled between the second capacitance and the control terminal of the second n-type transistor; and
a fourth switch coupled between the third switch and the reference node.

15. The circuit of claim 14, wherein the drive stage is configured to:
close the first and fourth switches at the same time, and
close the second and third switches at the same time.

16. The circuit of claim 10, wherein the drive stage further comprises a first current generator coupled to a control terminal of the fourth transistor.

17. The circuit of claim 16, wherein the drive stage further comprises a first switch coupled between the first current generator and the control terminal of the fourth transistor.

18. A USB device comprising:
an output terminal;
a communication logic;
a receiver coupled to the communication logic; and
a driver comprising:
an output node coupled to the output terminal and to the receiver,
a first supply terminal,
a second supply terminal,
a first transistor of a first type having a first current path terminal coupled to the output node and a second current path terminal coupled to the first supply terminal,
a second transistor of the first type having a first current path terminal coupled to the second supply terminal, and a second current path terminal coupled to the output terminal,
a first current generator,
a second current generator,
a third current generator,
a first capacitance coupled between the first current generator and the second supply terminal,
a second capacitance having a first terminal coupled to the output node,
a first switch coupled between a control terminal of the second transistor and the second supply terminal,
a second switch coupled between the first capacitance and the first current generator,
a third switch coupled between the first capacitance and a control terminal of the first transistor,
a fourth switch coupled between the second current generator and the control terminal of the first transistor, and
a fifth switch having a first terminal and a second terminal, the first terminal of the fifth switch coupled to the third current generator and a second terminal of the second capacitance, the second terminal of the fifth switch coupled to the control terminal of the second transistor, wherein the fifth switch is further coupled between the second capacitance and the control terminal of the second transistor.

19. The USB device of claim 18, wherein the USB device is a USB charger.

20. The USB device of claim 18, wherein the USB device is a USB load.

\* \* \* \* \*